United States Patent [19]

Bonds

[11] Patent Number: 5,881,375
[45] Date of Patent: Mar. 9, 1999

[54] PAGING TRANSMITTER HAVING BROADBAND EXCITER USING AN INTERMEDIATE FREQUENCY ABOVE THE TRANSMIT FREQUENCY

[75] Inventor: David Kent Bonds, Quincy, Ill.

[73] Assignee: Glenayre Electronics, Inc., Charlotte, N.C.

[21] Appl. No.: 792,620

[22] Filed: Jan. 31, 1997

[51] Int. Cl.$^6$ ................................................ H04Q 7/20
[52] U.S. Cl. ........................... 455/118; 455/102; 455/119
[58] Field of Search ................................. 455/126, 503, 455/38.1, 102, 118, 119, 22; 375/296, 129

[56] References Cited

U.S. PATENT DOCUMENTS 5,418,818   5/1995   Mardchetto et al. ................... 375/264
5,638,401   6/1997   Jones ........................................ 455/102
5,732,333   2/1996   Cox et al. ................................ 455/126

Primary Examiner—Edward F. Urban
Assistant Examiner—Tilahun Gesesse
Attorney, Agent, or Firm—Christensen O'Connor Johnson & Kindness PLLC

[57] ABSTRACT

The present invention teaches a paging transmitter that has an exciter that upconverts a modulated signal to an intermediate frequency (IF) above that of the transmit frequency. By so doing, the paging transmitter can broadcast a large range of transmit frequencies. Additionally, filtering of unwanted byproducts during the upconversion process is significantly simplified.

2 Claims, 2 Drawing Sheets

PAGING TRANSMITTER HAVING BROADBAND EXCITER USING AN INTERMEDIATE FREQUENCY ABOVE THE TRANSMIT FREQUENCY

FIELD OF THE INVENTION

This invention relates to paging transmitters, and more particularly, to a paging transmitter with an improved exciter.

BACKGROUND OF THE INVENTION

An integral part of any paging system is the paging transmitter. The paging transmitters of a paging system are located at geographically spaced apart locations to supply broadcast coverage to a wide geographic area. The details of a paging system can be found in U.S. Pat. No. 5,481,258 to Fawcett et al., U.S. Pat. No. 5,365,569 to Witsaman et al. and U.S. Pat. No. 5,416,808 to Witsaman et al., commonly assigned to the assignee of the present invention and incorporated herein by reference.

A paging transmitter includes certain important primary components, such as the power amplifier, the exciter, and the transmitter controller. The present invention relates to the exciter of a paging transmitter. The exciter is the portion of the paging transmitter that receives data to be encoded (or more accurately termed modulated) onto a carrier frequency suitable for radio-frequency (RF) transmission.

For simple types of modulation, such as amplitude modulation (AM) or frequency modulation (FM), the modulation is often applied directly to the final carrier frequency, without any intervening steps. For more complex types of modulation, however, it is often more convenient for various reasons to apply the modulation to a lower, intermediate frequency (IF). The IF is then upconverted, or shifted up to the desired transmission frequency, using a frequency mixer and a local oscillator (LO).

In the process of upconversion, several undesired frequency byproducts are created along with the desired transmission frequency of the carrier. Among these are the LO frequency, the image of the desired transmission frequency reflected about the LO frequency, and perhaps intermodulation products of these other byproducts against one another. These byproducts are generally eliminated by passing the modulated carrier transmission frequency through a frequency selective filter.

Especially in digital transmitter systems, due to limitations on how quickly the data can be processed, the first IF may be quite low compared to the desired transmit frequency. This leads to impractical filtering requirements, as the desired transmission frequency, the LO frequency, and reflected image are too close in frequency to one another. The filter requirement can be made practicable by employing an additional IF and upconversion process, using a frequency between the first IF and the desired transmission frequency. This type of system is suitable for a paging transmitter that is adapted to broadcast at transmit frequencies spanning less than an octave.

However, it is desirable that a paging transmitter have the flexibility to broadcast at carrier frequencies that span up to two octaves, for example from 130–512 MHz. A paging transmitter that is frequency agile over a wide range is important for uniformity of manufacturing purposes and for providing a paging system capable of broadcast over several bands.

The primary difficulties in designing a paging transmitter with such a wide broadcast range are twofold. First, there may be significant difficulty in filtering away the upconversion byproducts. Second, the LO must have a wide tuning range of frequencies. To illustrate, to have an exciter span the 130–512 MHz range, the LO would have to be tunable from 40–422 MHz or from 220–602 MHz (assuming that a first IF of 90 MHz is used). In the first range, the LO would have to be tunable over a decade and in the second range, the LO would have to be tunable over nearly two octaves. LO's with this frequency agility, in this frequency range, are impractical for paging transmitter applications.

One prior art attempt to solve this problem is to use multiple LO's for each of the possible broadcast carrier frequencies. However, this would typically include higher costs for the multiple LO's. Moreover, because the LO and image frequencies would sometimes fall within the desired transmit band, an output bandpass filter that is retunable on-the-fly, or a switchable bank of such filters, would also be needed if fast channel-change times are required. This too is impractical.

The present invention solves these and other problems of the present invention. In particular, an exciter design and system that is capable of supporting a wide range of carrier frequencies is disclosed.

SUMMARY OF THE INVENTION

A method of generating a paging signal containing paging data for transmission by a paging transmitter at a transmit frequency is disclosed. The method comprises the steps of modulating said paging data onto a baseband signal; upconverting said baseband signal to an intermediate frequency, said second intermediate frequency higher than said transmit frequency; and downconverting said intermediate frequency to said transmit frequency.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF A PREFERRED EMBODIMENT

In essence, the present invention teaches a paging transmitter that has an exciter that upconverts a modulated signal to an intermediate frequency (IF) above that of the transmit frequency. By so doing, the paging transmitter can broadcast a large range of transmit frequencies. Additionally, filtering of unwanted byproducts during the upconversion process is significantly simplified.

The present invention is related to the analog upconversion portion of an exciter. An example of a digital exciter is described in my copending U.S. patent application Ser. No. 08/601,118 entitled "Linear Transmitter Using Predistortion" to Cox et al. filed Feb. 14, 1996 and herein incorporated by reference.

The analog upconversion takes place after paging data is modulated onto a baseband signal. For the digital exciter described in my copending application, the paging data is digital data and the baseband signal has a frequency of 5.6

MHz. For an analog exciter, the paging data is an analog signal and the baseband signal typically has a frequency, in one actual embodiment of 100 KHz. It can be appreciated that the precise frequency of the modulated baseband signal is not important and the scope of the patent should not be limited thereby.

Figure 1:
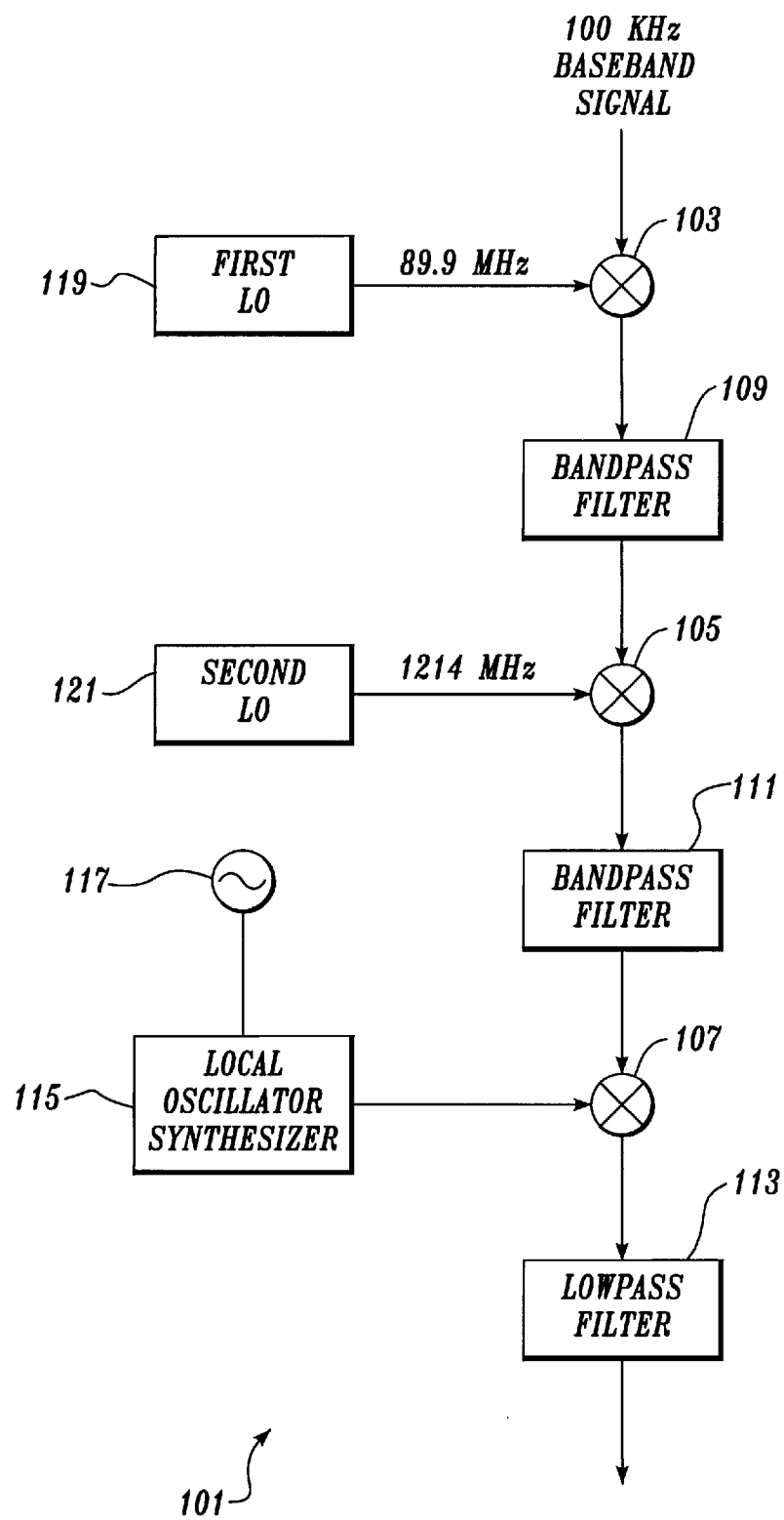
FIG. 1 is a simplified block diagram of an analog upconversion portion of an exciter formed in accordance with the present invention.

A preferred embodiment of the present invention is shown in schematic form in FIG. 1. FIG. 1 shows an analog upconversion portion 101 of an exciter that includes a first mixer 103, a second mixer 105, a third mixer 107, a first bandpass filter 109, a second bandpass filter 111, a lowpass filter 113, a local oscillator synthesizer 115, a reference oscillator 117, a first LO 119, and a second LO 121.

The operation of the analog upconversion portion 101 is described below. During the description herein, exemplary choices for baseband signal frequencies, IFs, and other frequencies are provided. They are intended to provide but one example of the present invention applied to one situation and should not be construed as limiting.

Turning now to FIG. 1, a baseband signal at 100 KHz is mixed in first mixer 103 with a 89.9 MHz signal supplied from first LO 119. The first mixer 103 serves as a first upconversion to a first IF of 90 MHz. This provides an output from first mixer 103 having frequency components at 90 MHz (the desired signal), 89.9 MHz (the LO signal), and 89.8 MHz (the image byproduct of mixing).

The output of first mixer 103 is provided to the first bandpass filter 109 for filtering. The first bandpass filter 109 is designed and operative to remove the components of the output of first mixer 103 at 89.8 MHz and 89.9 MHz. Thus, the input to the second mixer 105 is a 90 MHz first IF containing the paging data.

The 90 MHz IF signal is then mixed in second mixer 105 with a 1214 MHz signal from second LO 121. The second mixer 103 performs a second upconversion to a second IF of 1124 MHz. This provides an output from second mixer 105 having frequency components at 1124 MHz (the desired signal), 1214 MHz (the LO signal), and 1304 MHz (the image byproduct of mixing). Note importantly that the second IF is well above the range of carrier transmission frequencies of a typical paging transmitter.

The output of second mixer 103 is then provided to the second bandpass filter 111 that is designed and operative to filter out the components of the output of second mixer 105 at 1214 MHz and 1304 MHz. Thus, the input to the third mixer 107 is a 1124 MHz second IF signal containing the paging data.

The 1124 MHz IF is then mixed in third mixer 107 with a tunable third LO signal provided by synthesizer 115. The precise frequency of the third LO is dependent upon the desired carrier transmission frequency of the paging transmitter. Indeed, it is anticipated that the third LO would be changed on-the-fly as the paging transmitter requires transmission on different channels. In the preferred embodiment the third LO may have a range of between 994–612 MHz. This would allow the output of the third mixer 107 to be in the range of 130 MHz to 512 MHz. Note importantly that the tuning range of the third LO is relatively low.

The third mixer 107 serves as a downconversion to the final carrier transmission frequency. If we assume that the desired carrier transmission frequency is 130 MHz, then the third LO should be at 994 MHz. Similarly, if the desired carrier transmission frequency is 512 MHz, then the third LO should be at 612 MHz. In the first case, the output of the third mixer 107 will have components at 130 MHz, 994 MHz, and 2.118 GHz. In the second case, the output of the third mixer 107 will have components at 512 MHz, 612 MHz, and 1.736 GHz.

In any case, the output of the third mixer 107 is provided to lowpass filter 113 that filters out the high end of the output from third mixer 107, most notably the third LO (between 612–994 MHz) and the high frequency image. In this preferred embodiment, the lowpass filter 113 may have a frequency cutoff at, for example, 562 MHz.

As noted above, the choice of the frequency of the second IF signal is relatively flexible. In the example above, the second IF signal is at 1124 MHz. The choice of the frequency of the second IF signal is, however, dependent upon several considerations. First, the higher in frequency the second IF signal, the lower the tuning ratio for the synthesizer 115 is required. In addition, lowpass filter 113 would be easier to implement for a higher frequency for the second IF signal. Nevertheless, as the frequency of the second IF increases, bandpass filter 111 becomes more difficult to realize and implement. Additionally, when moving to higher frequencies, the design challenges for the exciter system increase. Thus, the choice of the frequency of the second IF signal are dictated by multiple engineering considerations.

One promising possibility for paging transmitter applications is the choice of 1800 MHz as the frequency of the second IF signal. Electronic components that are operate in this frequency regime are commonly being developed and are readily available at low cost. Using an 1800 MHz second IF, the third LO from synthesizer 115 would have to provide a tunable signal between 1288–1670 MHz or 1930–2312 MHz. The tuning ratio for the synthesizer 115 for the lower range is 1.30 and for the higher range 1.19. It can be appreciated by those skilled in the art that by having a lower tuning ratio, the synthesizer can be optimized for lower phase noise and quicker lockup times.

Figure 2:
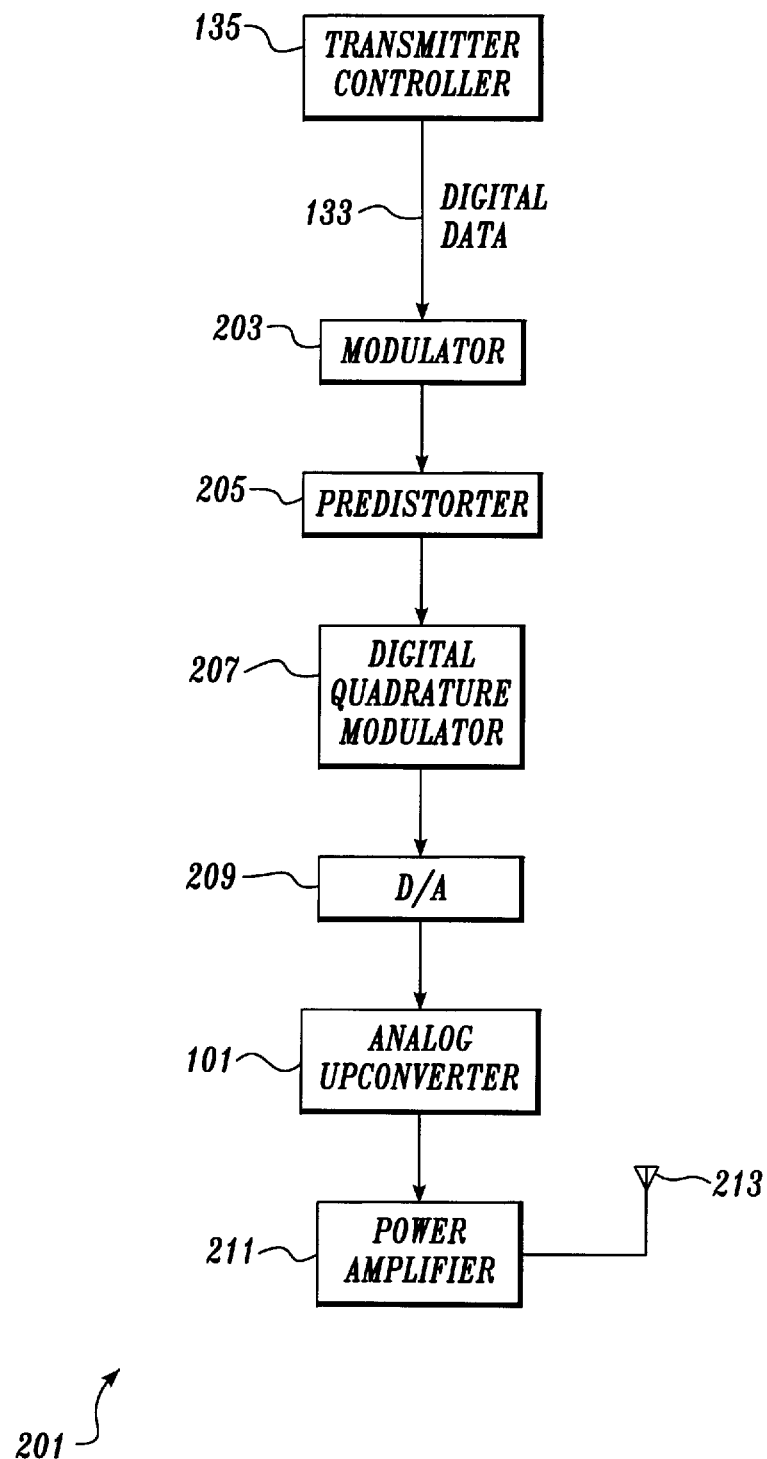
FIG. 2 is a paging transmitter formed in accordance with the present invention.

Turning now to FIG. 2, the analog upconverter 101 is shown integrated into a paging transmitter 201. The transmitter 201 includes a modulator 203, a predistorter 205, a digital quadrature modulator 207, a digital-to-analog converter 209, an analog upconverter 101, a power amplifier 211 and a transmitting antenna 213. In other embodiments, additional power amplifiers may be connected in parallel with the power amplifier 211 to increase the gain of the transmitter 101.

Digital data that is to be broadcast by the transmitter 201 is provided to the modulator 203, as represented by line 133. The data may be provided by any source. In a preferred embodiment, the transmitter 201 is adapted for use as a paging transmitter, although it can be used in any radio frequency (RF) application. In a preferred embodiment, the data input into the modulator 203 is provided from a transmitter controller 135 that is operative to receive data over a link channel from a paging terminal and formulate the data for transmission. The details of the construction of a transmitter controller, and indeed an entire paging system, can be found in U.S. Pat. No. 5,481,258 to Fawcett et al., U.S. Pat. No. 5,365,569 to Witsaman et al. and U.S. Pat. No. 5,416,808 to Witsaman et al., commonly assigned to the assignee of the present invention and incorporated herein by reference.

In a preferred embodiment, the data is a series of digital symbols, with each symbol representing a predetermined number of bits. The number of bits per symbol is dependent upon the particular modulation scheme being transmitted by the transmitter 201. Modulation formats in typical conventional paging data systems include formats such as, for example, two or four tone frequency shift keying (FSK)

modulation and QAM. QAM formats include, for example, an eight level QAM modulation scheme that would have a three-bit symbol. Similarly, a sixteen level QAM scheme would have four bits per symbol. It can be appreciated that for a three-bit symbol, there are eight possible symbols. Likewise, for a four-bit symbol, there are sixteen possible symbols. Throughout most of this discussion, the example used will be of a four-bit symbol, which corresponds to a sixteen level QAM scheme.

The modulator 203 is operative to correlate each particular symbol with predetermined in-phase and quadrature output signals. Thus, for each unique symbol, a different combination of in-phase and quadrature component signals for the baseband signal is output by the modulator 203.

Additionally, as each symbol is processed, the modulator 203 does not "instantaneously" transition from one symbol to another. Such an instantaneous change in in-phase and quadrature output signals would result in excessive frequency "spreading" outside the assigned transmit channel. Instead, by means of digital filtering, a smooth transition between symbols (and therefore in-phase and quadrature output signals) is achieved. One embodiment of this technique which is applicable to an FSK system is disclosed in more detail in U.S. Pat. No. 5,418,818 to Marchetto et al., assigned to the same assignee as the present invention and incorporated herein by reference.

Next, the in-phase and quadrature component signals output by the modulator 203 are input into the predistorter 205. The predistorter 205 is operative to modify the in-phase and quadrature component signals output from the modulator 203 so as to compensate for any distortion that takes place in the power amplifier 213.

The output of the predistorter 205 is then provided to the digital quadrature modulator 207. The digital quadrature modulator 207 converts the in-phase and quadrature component signals into a single real digital signal. The real digital signal from the digital quadrature modulator 207 is received by a D-A converter 209 that converts the real digital signal to an analog signal, producing a baseband signal that contains the paging digital data.

The signal from the D-A converter 209 is provided to the analog upconverter 101, which converts the baseband signal to a broadcast frequency signal having a frequency within a frequency band of the paging system as detailed above.

The power amplifier 211 receives the carrier transmission frequency signal from the analog upconverter 101, amplifies the signal, and provides the amplified signal to the transmitting antenna 213 for transmission. The power amplifier 211 can be any suitable power amplifier such as, for example, the power amplifier disclosed in copending U.S. patent application Ser. No. 08/601,370 entitled "High Power Amplifier Using Parallel Transistors" to Walker, assigned to the same assignee as the present invention and incorporated herein by reference. In a representative embodiment, four such power amplifiers are used in parallel, but fewer or more can be used in other configurations.

The paging transmitter described above is a digital transmitter. However, analog upconverter 101 of the present invention could easily be used in an analog transmitter and the description above should not be construed as limiting.

The embodiments of the analog upconverter described above are illustrative of the principles of the present invention and are not intended to limit the invention to the particular embodiments described. For example, while a preferred embodiment of the analog upconverter has been described in connection with a paging transmitter, the upconverter will find application in many broadcast environments. Accordingly, while a preferred embodiment of the invention has been illustrated and described, it will be appreciated that in light of this disclosure, various changes can be made therein without departing from the spirit and scope of the invention.

The embodiments of the invention in which an exclusive property or privilege is claimed are defined as follows:

1. A paging transmitter comprising:
   a digital modulator coupled to receive digital data, wherein said modulator is capable of providing an in-phase signal and a quadrature signal dependent on said digital data;
   a digital quadrature modulator operative to provide a digital signal dependent on a combination of said in-phase signal and said quadrature signal provided by said digital modulator;
   a digital-to-analog converter coupled to said digital quadrature modulator, wherein said digital-to-analog converter is capable of providing an analog signal dependent on said digital signal provided by said digital quadrature modulator;
   an analog upconverter coupled to said digital-to-analog converter, wherein said analog upconverter is capable of providing a carrier transmission frequency signal dependent on said analog signal provided by said digital-to-analog converter, said analog upconverter including:
      (i) a first mixer for upconverting said analog signal to an intermediate frequency signal having a frequency higher than said carrier transmission frequency signal;
      (ii) a second mixer for downconverting said intermediate frequency signal to said carrier transmission frequency signal;
   a power amplifier coupled to said analog upconverter for amplifying said carrier transmission frequency signal from said analog upconverter; and
   an antenna coupled to said power amplifier, wherein said antenna is capable of broadcasting said amplified analog signal provided by said power amplifier.

2. The paging transmitter of claim 1 wherein said analog upconverter further includes a lowpass filter coupled to said second mixer.

* * * * *